(12) United States Patent
Eaton et al.

(10) Patent No.: US 8,880,224 B2
(45) Date of Patent: Nov. 4, 2014

(54) AIRFLOW MANAGING SYSTEM, A METHOD OF MONITORING THE AIRFLOW IN AN HVAC SYSTEM AND A HVAC SYSTEM

(75) Inventors: Erroll L. Eaton, Carrollton, TX (US); Mark D. Hess, Plano, TX (US); Richard A. Mauk, Lewisville, TX (US); Stephen A. Walter, Flower Mound, TX (US); David M. Wynnick, Lewisville, TX (US)

(73) Assignee: Lennox Industries Inc., Richardson, TX (US)

( * ) Notice: Subject to any disclaimer, the term of this patent is extended or adjusted under 35 U.S.C. 154(b) by 1014 days.

(21) Appl. No.: 12/694,487

(22) Filed: Jan. 27, 2010

(65) Prior Publication Data
US 2010/0298993 A1 Nov. 25, 2010

Related U.S. Application Data

(60) Provisional application No. 61/180,405, filed on May 21, 2009.

(51) Int. Cl.
*G01P 3/489* (2006.01)
*H01R 13/645* (2006.01)
*H01R 12/50* (2011.01)

(52) U.S. Cl.
CPC ........ *H01R 13/6456* (2013.01); *H01R 23/7073* (2013.01)
USPC ........... 700/276; 700/282; 700/301; 700/304; 73/1.16; 73/1.35; 73/1.37

(58) Field of Classification Search
CPC ............... F24F 11/0086; F24F 11/006; F24F 2011/0067; G05D 7/0635; F16K 37/0075; F15B 19/005; A01K 1/031; G01P 3/489

USPC .......... 700/276, 282, 301, 304; 73/1.16, 1.35, 73/1.37

See application file for complete search history.

(56) References Cited

U.S. PATENT DOCUMENTS

| 5,073,999 A | * | 12/1991 | Thomas et al. .................. 5/615 |
| 5,426,975 A | * | 6/1995 | Stark ............................... 73/202 |
| 5,447,414 A | * | 9/1995 | Nordby et al. ................. 417/20 |
| 5,586,861 A | * | 12/1996 | Berger .......................... 415/118 |
| 5,839,374 A | * | 11/1998 | Conner et al. ................ 110/162 |

(Continued)

FOREIGN PATENT DOCUMENTS

| EP | 1865205 | * | 12/2007 | .............. F04D 27/00 |
| WO | WO2008024918 | * | 2/2008 | .............. F24F 7/007 |

OTHER PUBLICATIONS

A World of Automation Solutions; by Yaskawa Electric America, Inc.; Published Oct. 1, 2006; 4 pages; printed from Internet on May 5, 2014.*

(Continued)

*Primary Examiner* — Ronald Hartman, Jr.

(57) ABSTRACT

An airflow managing system for monitoring airflow of a HVAC system, a HVAC system and a method of monitoring the airflow in a HVAC system is provided. In one embodiment, the airflow managing system includes: (1) an air pressure sensor configured to obtain an air pressure measurement directly from a scroll of an air blower of the HVAC system and (2) a HVAC controller configured to determine an airflow rate for the HVAC system based on the air pressure measurement and corresponding parameters associated with the air blower.

21 Claims, 2 Drawing Sheets

(56) References Cited

U.S. PATENT DOCUMENTS

| | | | |
|---|---|---|---|
| 6,050,772 A * | 4/2000 | Hatakeyama et al. | 415/1 |
| 6,241,463 B1 * | 6/2001 | Bahner et al. | 415/17 |
| 6,369,544 B1 * | 4/2002 | Kadah | 318/772 |
| 6,462,494 B1 * | 10/2002 | Schone et al. | 318/433 |
| 6,864,659 B2 * | 3/2005 | Ratz et al. | 318/772 |
| 6,866,202 B2 * | 3/2005 | Sigafus et al. | 236/11 |
| 6,893,220 B2 * | 5/2005 | Eaton et al. | 415/206 |
| 7,036,559 B2 * | 5/2006 | Stanimirovic | 165/11.1 |
| 7,246,997 B2 * | 7/2007 | Liu et al. | 415/204 |
| 7,770,806 B2 * | 8/2010 | Herzon et al. | 236/1 C |
| 7,821,218 B2 * | 10/2010 | Butler et al. | 318/461 |
| 7,915,847 B2 * | 3/2011 | Jeung | 318/461 |
| 2003/0030408 A1 * | 2/2003 | Ratz et al. | 318/772 |
| 2003/0042860 A1 * | 3/2003 | Sulfstede | 318/432 |
| 2004/0219875 A1 * | 11/2004 | Mills | 454/256 |
| 2005/0034764 A1 * | 2/2005 | Hanh et al. | 137/487.5 |
| 2005/0159844 A1 * | 7/2005 | Sigafus et al. | 700/275 |
| 2005/0280384 A1 * | 12/2005 | Sulfstede | 318/432 |
| 2008/0188173 A1 * | 8/2008 | Chen et al. | 454/239 |
| 2010/0076606 A1 * | 3/2010 | Gatley et al. | 700/276 |
| 2010/0082162 A1 * | 4/2010 | Mundy et al. | 700/277 |
| 2010/0256820 A1 * | 10/2010 | Jeung et al. | 700/276 |
| 2011/0250051 A1 * | 10/2011 | Smiley et al. | 415/26 |
| 2012/0171050 A1 * | 7/2012 | Havard, Jr. | 417/44.1 |

OTHER PUBLICATIONS

Related Case U.S. Appl. No. 12/566,535, filed Sep. 24, 2009 to Rakesh Goel et al.; "An Air Blower Validator, An HVAC System and a Method of Manufacturing an HVAC System" Currently Pending.

* cited by examiner

AIRFLOW MANAGING SYSTEM, A METHOD OF MONITORING THE AIRFLOW IN AN HVAC SYSTEM AND A HVAC SYSTEM

CROSS-REFERENCE TO RELATED APPLICATION

This application claims the benefit of U.S. Provisional Application Ser. No. 61/180,405, filed by Mark Beste, et al., on May 21, 2009, entitled "Comprehensive HVAC Control System," incorporated herein by reference in its entirety.

TECHNICAL FIELD

This application is directed, in general, to heating, ventilating and air conditioning (HVAC) systems and, more specifically, to monitoring airflow in HVAC systems.

BACKGROUND

HVAC systems can be used to regulate the environment within an enclosure. Typically, an air blower is used to pull air from the enclosure into the HVAC system through ducts and push the air back into the enclosure through additional ducts after conditioning the air (e.g., heating or cooling the air). Understanding the airflow through a HVAC system in the design stage is helpful to prevent cooling or heating variances in the enclosure. There is also a need to understand the actual airflow from HVAC equipment into the enclosure after installation.

For installed HVAC systems, the actual airflow rate is often needed. For example, regulations and the Leadership in Energy and Environmental Standards (LEED) initiative require the measurement of airflow during installation and operation. During construction, a commissioning phase is typically conducted to inspect a new air conditioning installation, and verify that the new system is running properly and efficiently. The commissioning phase can be expensive, labor intensive and time prohibitive. Additionally, the measurements obtained during commissioning may be less than exact and require adjustments after construction. Monitoring the actual airflow of a HVAC system after installation can also be difficult due to the expense and unreliability of sensors and other equipment needed.

SUMMARY

One aspect provides an airflow managing system for monitoring airflow of a HVAC system. In this particular embodiment, the airflow managing system includes: (1) an air pressure sensor configured to obtain an air pressure measurement directly from a scroll of an air blower of the HVAC system and (2) a HVAC controller configured to determine an airflow rate for the HVAC system based on the air pressure measurement and corresponding parameters associated with the air blower.

In another aspect, a method of monitoring air flow in a HVAC system is provided that includes: (1) obtaining an air pressure measurement directly from a scroll of an air blower of the HVAC system and (2) determining an airflow rate for the HVAC system based on the air pressure measurement and corresponding parameters associated with the air blower.

In yet another aspect, a HVAC system is provided that includes: (1) an air blower and (2) an airflow managing system for monitoring airflow of the HVAC system having (2A) an air pressure sensor configured to obtain an air pressure measurement directly from a scroll of the air blower and (2B) a HVAC controller configured to determine an airflow rate for the HVAC system based on the air pressure measurement and corresponding parameters associated with the air blower.

BRIEF DESCRIPTION

Reference is now made to the following descriptions taken in conjunction with the accompanying drawings, in which.

DETAILED DESCRIPTION

Figure 1:
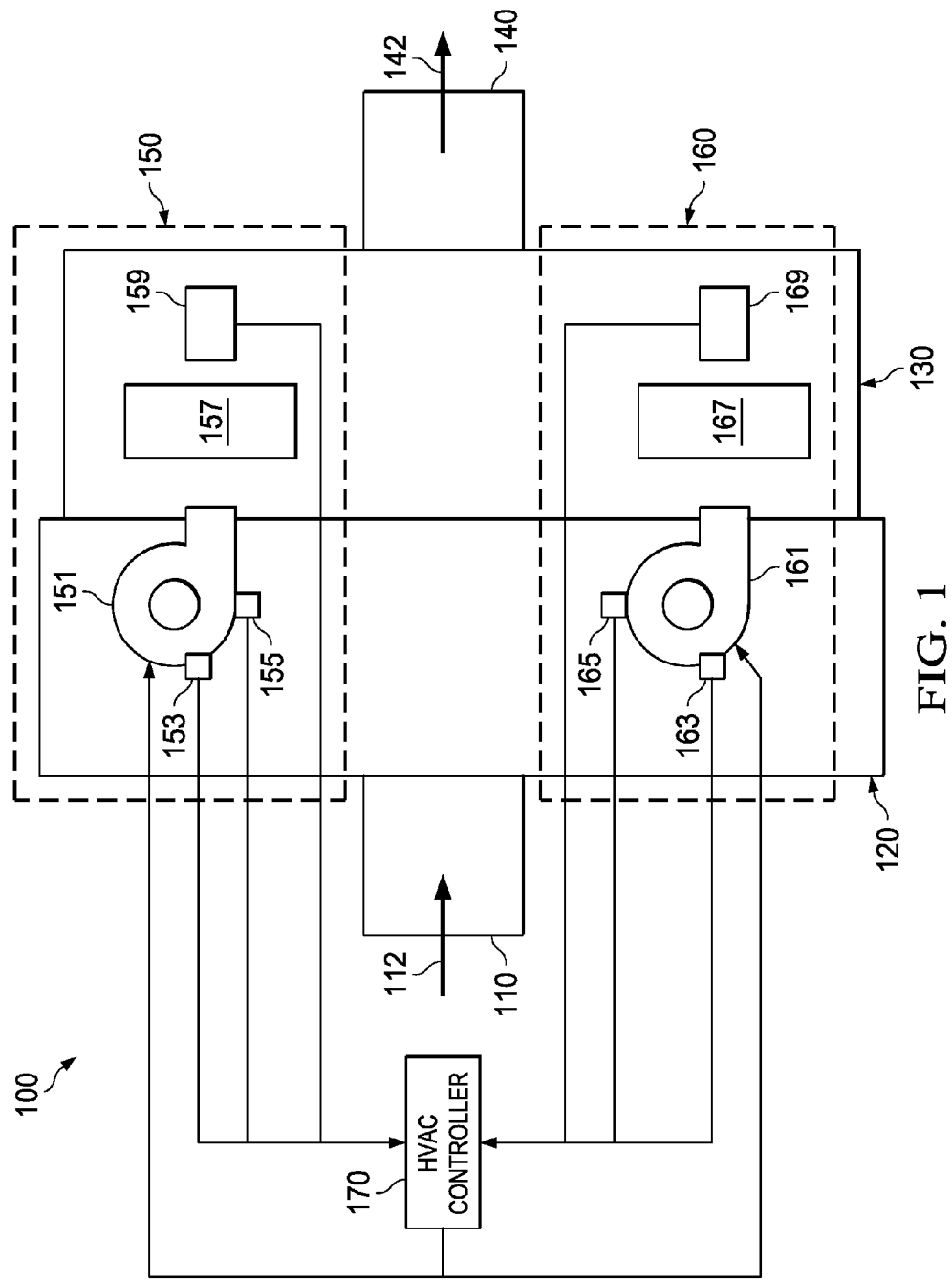
FIG. 1 is a block diagram of an embodiment of a HVAC system constructed according to the principles of the disclosure.

Disclosed herein are embodiments that determine air flow in a HVAC system based on a pressure reading (e.g., static pressure) obtained directly from a scroll wall of an air blower in the HVAC system. Thus, for installed HVAC systems, the disclosed embodiments provide an improved method or system for determining the actual airflow rate in HVAC systems. The disclosed embodiments, therefore, may reduce the time required to verify that a new HVAC system is running properly and efficiently. Additionally, by knowing the actual airflow rate, the disclosed embodiments can be used to more easily make adjustments after installation. Accordingly, the disclosure may reduce the amount of time needed for installation and improve the ability to efficiently operate HVAC systems after installation.

A HVAC controller may employ the directly measured pressure reading as a link to a predetermined data set of parameters that was generated for the air blower under simulated conditions. The parameters include an air flow rate that corresponds to the measured air pressure for the air blower. The HVAC controller may also employ operating parameters of the air blower along with the measured air pressure to determine the corresponding airflow rate. Thus, in one embodiment, the HVAC controller may include a data set of parameters for a specific air blower (or even air blowers) that were obtained under simulated conditions (e.g., simulated duct work for different configurations of possible installations). Accordingly, the air blower or air pressure reading from the air blower can be used as a constant to correlate the actual installation to an established simulation from which the air flow rate of the HVAC system can be determined. The air blower may be employed for both a cooling and heating subsystem of a HVAC unit. In some embodiments, separate air blowers may be used for the cooling and heating subsystems.

The HVAC controller can then employ the determined air flow rate to determine the required motor torque for a given system pressure (e.g., static pressure). The calculated torque values may then be supplied to a motor of the air blower via, for example, an inverter or variable frequency drive, to control the speed of the air blower and generate a new airflow.

The HVAC controller can also monitor the airflow in the HVAC system via the measured air pressure at the air blower. Monitoring may indicate issues with installation, equipment set-up or equipment failure. Each of these may have a negative impact on energy efficiency and energy costs. For example, gas heat units often require an adjustment due to altitude and other installation variables. Without adjustments, energy consumption may be higher due to inefficiency. As disclosed herein, the HVAC controller can monitor the airflow and provide the adjustments needed. Thermocouples in the flue pipe and other sensors, such as carbon monoxide (CO), Oxygen (O) and carbon dioxide (CO2) sensors, can be used along with the air pressure sensor to provide input to the HVAC controller for monitoring and diagnosis. Zip code, altitude or geographic information may be used to establish a baseline for monitoring that can be used to report fault codes or indicate a need for service or repair.

FIG. 1 is a block diagram of an embodiment of a HVAC system 100 constructed according to the principles of the disclosure. The HVAC system 100 includes a return duct 110, a return plenum 120, a supply plenum 130, a supply duct 140, a cooling subsystem 150, a heating subsystem 160 and a HVAC controller 170. The cooling subsystem 150 includes a cooling air blower 151, a cooling air pressure sensor 153, cooling air blower sensors 155, a cooling coil 157 and cooling sensors 159. The heating subsystem 160 includes a heating air blower 161, a heating air pressure sensor 163, heating air blower sensors 165, a heating element 167 and heating sensors 169. At least some of the operation of the HVAC system 100 can be controlled by the HVAC controller 170 based on inputs from the various sensors mentioned above. One skilled in the art will understand that the HVAC system 100 may include additional components and devices that are not presently illustrated or discussed but are typically included in a HVAC system, such as, a power supply. A thermostat (not shown) is also typically employed with a HVAC system 100 and used as a user interface.

The cooling subsystem 150 is designed to provide cooled air to an enclosure (not shown). The cooling air blower 151 is configured to circulate air over the cooling coils 157 and through the enclosure by suctioning air from the enclosure through the return duct 110 and the return plenum 120, as indicated by arrow 112, and discharging air to the enclosure, as indicated by arrow 142, through the supply plenum 130 and the supply duct 140. The supply plenum 130 is in fluid communication with the supply duct 140 to supply discharged air to the enclosure.

The heating subsystem 160 is designed to provide heated air to the enclosure. The heating air blower 161 is configured to circulate air over the heating element 167 and through the enclosure by suctioning air from the enclosure through the return duct 110 and the return plenum 120, as indicated by arrow 112, and discharging air to the enclosure, as indicated by arrow 142, through the supply plenum 130 and the supply duct 140.

The cooling air blower 151 and the heating air blower 161 may be conventional blowers used in HVAC systems to circulate cooled and heated air, respectively, through an enclosure. In some embodiments, one or both of the cooling air blower 151 and the heating air blower 161 may include a variable speed motor and operate at various speeds. Each of the cooling air blower 151 and the heating air blower 161 has a housing that includes, for example, a blower motor and wheel (not illustrated).

The cooling air blower 151 and the heating air blower 161 may be conventional air blowers that are typically employed in HVAC systems. In one embodiment, the cooling air blower 151 and the heating air blower 161 are centrifugal blowers with forward or backward swept fan blades. In other embodiments, airfoil shaped blades or radial shaped blades may be used. The cooling coil 157 and the heating element 167 may also be conventional units that are typically employed in HVAC systems. In one embodiment, the heating element 167 is a gas heat burner typically used in a gas heat system of a HVAC system. The gas heat burner employs a mixture of air and gas to provide heat for the enclosure.

The cooling air pressure sensor 153 and the heating air pressure sensor 163 are configured to obtain an air pressure measurement directly from a scroll of the cooling air blower 151 and the heating air blower 161, respectively. The air pressure measurement may be total air pressure or static air pressure. With an air pressure measurement obtained directly at the scroll of the air blowers 151, 161, the HVAC controller 170 can calculate a velocity pressure employing the obtained pressure measurement and known characteristics of the air blowers 151, 161. The location of the air pressure sensors may vary in the air blowers 151, 161, to obtain the air pressure measurement. In some embodiments, an air pressure sensor may be located from or about 180 degrees to or about to 230 degrees from the cutoff of the air blowers, 151, 161. Either one or both of the cooling air pressure sensor 153 and the heating air pressure sensor 163 may be a pressure tap as described in U.S. patent application Ser. No. 12/566,535 entitled "AN AIR BLOWER VALIDATOR, A HVAC SYSTEM AND A METHOD OF MANUFACTURING A HVAC SYSTEM," by Rakesh Goel, et al., which is incorporated herein by reference in its entirety.

The cooling air blower sensors 155 and the heating air blower sensors 165 are configured to monitor the operation of the cooling air blower 151 and the heating air blower 161. The monitoring sensors may include an ammeter and a voltmeter that are used to determine a motor current and a motor voltage for the respective air blowers 151, 161. Additional sensors may be employed to monitor and obtain measurements of operating parameters of the respective air blowers 151, 161. For example, motor speed may also be obtained from monitoring sensors 155, 165. The monitoring sensors 155, 165, may be conventional sensors used to obtain the operating parameters of a motor.

The cooling sensors 159 and the heating sensors 169 are configured to monitor air in the HVAC system that has been conditioned by either the cooling subsystem 150 or the heating subsystem 160. The cooling sensors 159 may include a temperature sensor that is used to provide the air temperature to the HVAC controller 170. The heating sensors 169 may also include a temperature sensor that is used to provide the air temperature to the HVAC controller 170. In gas heat systems, the heating sensors 169 may include exhaust sensors that monitor carbon monoxide (CO) and carbon dioxide (CO2) for the heat portion 160.

The HVAC controller 170 is configured to determine an airflow rate for the HVAC system 100 based on an air pressure measurement obtained at the blower scroll of the cooling air blower 151 or the heating air blower 161, and corresponding parameters associated with the particular one of the air blowers 151, 161. The corresponding parameters may be theoretical or experimental data that pertains to the particular air blower model in the HVAC system 100. The corresponding parameters may be obtained in, for example, a lab environment. The corresponding parameters may be, for example, current, voltage, rpm, power, power factor, airflow, total system static pressure drop and motor torque. In some embodiments, the corresponding parameters may include customer selectable air flow setpoints such as minimum air flow, unoccupied air flow or maximum air flow.

The HVAC controller 170 may also employ operating parameters of the respective air blowers to determine the airflow rate. The operating parameters, such as the motor speed, motor current and motor voltage, may be obtained from the sensors 153, 163. The HVAC controller 170 can then use the air flow rate to calculate a corresponding torque required for the motor of each respective air blower 151, 161. The HVAC controller 170 may employ Fan Laws that are well understood in the art to determine a different torque value based on a known torque input. The HVAC controller 170 can then control the airflow rate over the coils 157 and the heating element 167 by adjusting the torque value obtained via the air pressure measurement. Modulation of airflow during heat up and cool down can improve the Annual Fuel Utilization Efficiency (AFUE) of gas heat exchangers tested according to standard 103 of the American Society of Heating, Refrigerating and Air-Conditioning Engineers (ASHRAE). By reducing excess supply air during heat-up, the AFUE can improve. Additionally, by controlling airflow, emissions can be controlled while efficiency is improved.

The HVAC controller 170 may include a processor, such as a microprocessor, configured to direct the operation of the HVAC system 100. Additionally, the HVAC controller 170 may include a memory section having further parameters associated with the air blower including the corresponding parameters. The memory section may be a conventional memory. The memory section may include a series of operating instructions that direct the operation of the HVAC controller 170 (e.g., the processor) when initiated thereby. The series of operating instructions may represent algorithms that are used to manage operation of the HVAC system 100 including calculating motor torques for a given system air pressure.

As illustrated in FIG. 1, the controller 170 is coupled to the various sensors and air blowers of the HVAC system 100. In some embodiments, the connections therebetween are through a wired-connection. A conventional cable and contacts may be used to couple the HVAC controller 170 to the various components of the HVAC system 100. In some embodiments, a wireless connection may also be employed to provide at least some of the connections.

Figure 2:
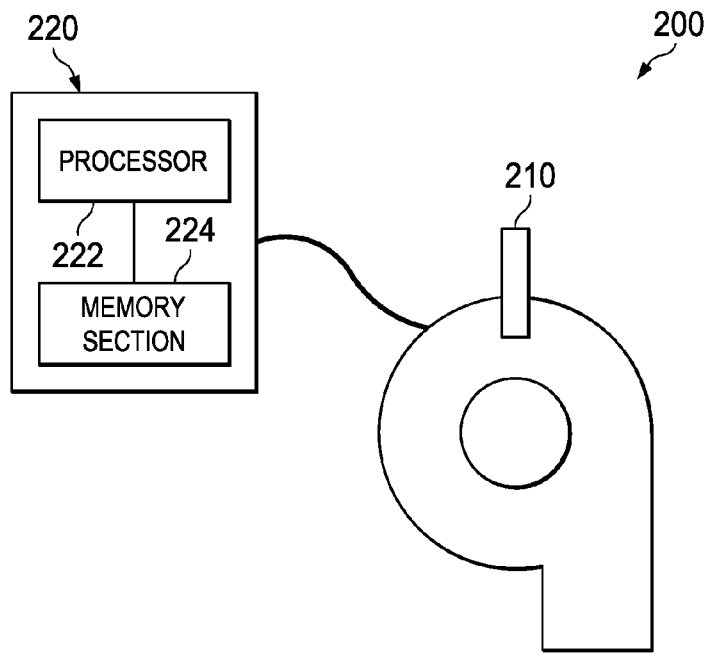
FIG. 2 is a diagram of an embodiment of an air airflow managing system constructed according to the principles of the disclosure.

FIG. 2 is a diagram of an embodiment of an airflow managing system 200 constructed according to the principles of the disclosure. The airflow management system 200 is configured to monitor airflow of a HVAC system. The airflow management system 200 includes an air pressure sensor 210 and a HVAC controller 220.

The air pressure sensor 210 is configured to obtain an air pressure measurement directly from a scroll of an air blower, as illustrated, of the HVAC system. The air blower may be used by the HVAC system for moving air in both a cooling subsystem and a heating subsystem. In some embodiments, the air blower may be used in either a cooling subsystem or a heating subsystem.

The HVAC controller 220 is configured to determine an airflow rate for the HVAC system based on the air pressure measurement from the air pressure sensor 210 and corresponding parameters associated with the air blower. Sensors, such as the cooling air blower sensors 153 and the heating air blower sensors 163 of FIG. 1, may be used to obtain the operating or performance parameters of the air blower and provide the parameters to the HVAC controller 170. The operating parameters may include the motor speed, motor current, and motor voltage of the air blower.

The HVAC controller 220 includes a processor 222 and a memory section 224. Additionally, the HVAC controller 220 may include additional components, such as an input port and an output port. The processor 222 is configured to determine the airflow rate employing input data (e.g., air pressure measurement and operating parameters) and data stored on the memory section 224. The data may represent theoretical or experimental data associated with the air blower. The data can represent the air blower operating under simulated conditions corresponding to different installations. The input data may be used to determine a corresponding air flow rate. The memory section 224 also includes formulas that the processor 222 can use to determine other parameters of the HVAC system.

Figure 3:
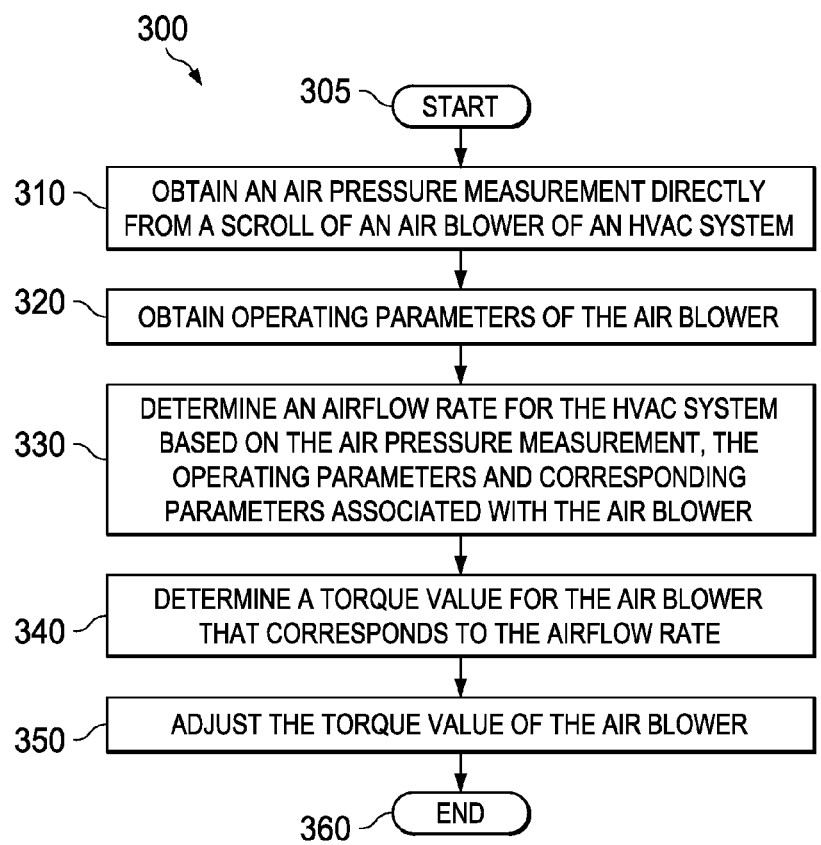
FIG. 3 is a flow diagram of an embodiment of a method of monitoring air flow in a HVAC system carried out according to the principles of the disclosure.

FIG. 3 is a flow diagram of an embodiment of a method of monitoring air flow in a HVAC system carried out according to the principles of the disclosure. A HVAC controller such as described with respect to FIG. 1 or FIG. 2 may be used to perform the monitoring. The HVAC controller may monitor the air flow based on input from sensors located in the HVAC system, such as an air pressure sensor located at the scroll of air blower of the HVAC system, and predetermined parameters associated with the air blower. The method 300 begins in a step 305.

In a step 310 an air pressure measurement is directly obtained from a scroll of an air blower of the HVAC system. The air pressure measurement may be a static pressure measurement. The air pressure sensor may be wirelessly or wired coupled to the HVAC controller.

Operating parameters for the air blower are also obtained in a step 320. The operating parameters may be obtained by sensors coupled to a motor of the air blower. Motor speed, motor voltage, and motor current may be determined by the sensors and transmitted to the HVAC controller.

An airflow rate for the HVAC system is then determined in a step 330 based on the air pressure measurement, the operating parameters and corresponding parameters associated with the air blower. The corresponding parameters may be stored in a memory section of the HVAC controller. The measured air pressure may be used to "look-up" an air flow rate in the corresponding parameters that correlates with the measured air pressure and the operating parameters.

In a step 340, a torque value for the air blower that corresponds to the airflow rate is determined. The torque value may be obtained from the corresponding parameters. Fan Laws may be used to determine the torque value. Other equations may also be employed to determine the torque value. For example, a HVAC controller may employ a polynomial or a multivariate equation to determine the torque value. The polynomial equation may be:

$$CFM = C1*Torque^3 + C2*Torque^2 + C3*Torque + C1.$$

The multivariate equation may be:

$$CFM = B1*Torque + B2*Current + B3*Torque*Current + B4*Current^2 + B5*Torque^2.$$

In these equations, CFM is the free air delivery of a fan (velocity×duct area), C1, C2, C3 are given coefficients for a particular air blower motor and Torque is the torque value for the motor. Additionally, B1, B2, B3, B4 and B5 are given coefficients for a particular air blower motor and Current is the operating current of the motor.

The torque value of the air blower is then adjusted in a step 350 based on a desired operating parameter for the HVAC system. The HVAC controller may adjust the torque value of the air blower via a motor interface. In a step 360, the method 300 ends.

Those skilled in the art to which this application relates will appreciate that other and further additions, deletions, substitutions and modifications may be made to the described embodiments.

What is claimed is:

1. An airflow managing system for monitoring airflow of an HVAC system, comprising:

an air pressure sensor configured to obtain an air pressure measurement directly from a scroll of an air blower of said HVAC system, wherein said air pressure sensor is not located adjacent a cut-off of said blower; and an HVAC controller configured to determine an airflow rate for said HVAC system based on said air pressure measurement and corresponding parameters associated with said air blower, wherein said corresponding parameters include a diameter of said air blower.

2. The airflow managing system as recited in claim 1 wherein said HVAC controller is further configured to determine said airflow rate based on HVAC system operating parameters.

3. The airflow managing system as recited in claim 2 wherein said HVAC system operating parameters include a parameter selected from the list consisting of:
motor speed of said air blower,
motor current of said air blower, and
motor voltage of said air blower.

4. The airflow managing system as recited in claim 1 wherein said air blower is a centrifugal blower having forward or backward swept fan blades.

5. The airflow managing system as recited in claim 1 wherein said air blower is for a cooling subsystem of said HVAC system.

6. The airflow managing system as recited in claim 1 wherein said air blower is employed for both a cooling subsystem and a heating subsystem of said HVAC system.

7. A method of monitoring air flow in an HVAC system, comprising:
obtaining, by an air pressure sensor, an air pressure measurement directly from a scroll of an air blower of said HVAC system, wherein said air pressure sensor is not located adjacent a cut-off of said blower; and
determining, by an HVAC controller, an airflow rate for said HVAC system based on said air pressure measurement and corresponding parameters associated with said air blower, wherein said corresponding parameters include a diameter of said air blower.

8. The method as recited in claim 7 wherein said HVAC controller is further configured to determine said airflow rate based on HVAC system operating parameters.

9. The method as recited in claim 8 wherein said HVAC system operating parameters include a parameter selected from the list consisting of:
motor speed of said air blower,
motor current of said air blower, and
motor voltage of said air blower.

10. The method as recited in claim 8 further comprising determining a torque value for said air blower that corresponds to said airflow rate.

11. The method as recited in claim 10 further comprising adjusting said torque value of said air blower based on a desired operating parameter for said HVAC system.

12. The method as recited in claim 11 wherein said desired operating parameter is associated with an air conditioning portion of said HVAC system.

13. The method as recited in claim 11 wherein said desired operating parameter is associated with a heating subsystem of said HVAC system.

14. An HVAC system, comprising:
an air blower; and
an airflow managing system for monitoring airflow of said HVAC system, including:
an air pressure sensor configured to obtain a air pressure measurement directly from a scroll of said air blower, wherein said air pressure sensor is not located adjacent a cut-off of said blower; and
an HVAC controller configured to determine an airflow rate for said HVAC system based on said air pressure measurement and corresponding parameters associated with said air blower, wherein said corresponding parameters include a diameter of said air blower.

15. The HVAC system as recited in claim 14 wherein said HVAC controller is further configured to determine said airflow rate based on operating parameters of said HVAC system.

16. The HVAC system as recited in claim 15 wherein said HVAC system operating parameters include a parameter selected from the list consisting of:
motor speed of said air blower,
motor current of said air blower, and
motor voltage of said air blower.

17. The HVAC system as recited in claim 14 wherein said HVAC system further comprises an air conditioning portion including coils and said air blower, said HVAC controller further configured to control said airflow rate over said coils employing said air pressure measurement.

18. The HVAC system as recited in claim 14 wherein said HVAC system further comprises a heating subsystem including a heating element and said air blower, said HVAC controller further configured to control said airflow rate over said heating element employing said air pressure measurement.

19. The HVAC system as recited in claim 18 wherein said heating element is a gas heat burner section, said HVAC controller further configured to control an air volume amount used for combustion in said gas heat burner section.

20. The HVAC system as recited in claim 14 further comprising at least one operating sensor configured to obtain an operating parameter of said HVAC system.

21. The HVAC system as recited in claim 14 wherein said HVAC controller includes a memory section having further parameters associated with said air blower including said corresponding parameters.

* * * * *